United States Patent [19]
Takagi

[11] Patent Number: 5,625,219
[45] Date of Patent: Apr. 29, 1997

[54] PROGRAMMABLE SEMICONDUCTOR DEVICE USING ANTI-FUSE ELEMENTS WITH FLOATING ELECTRODE

[75] Inventor: Mariko Takagi, Kanagawa-ken, Japan

[73] Assignee: Kabushiki Kaisha Toshiba, Kawasaki, Japan

[21] Appl. No.: 220,706

[22] Filed: Mar. 31, 1994

[30] Foreign Application Priority Data

Apr. 15, 1993 [JP] Japan .................................. 5-112195

[51] Int. Cl.[6] .......................... H01L 29/04; H01L 27/10; H01L 29/00
[52] U.S. Cl. ................. 257/530; 257/50; 257/209
[58] Field of Search ............................. 257/50, 529, 530, 257/209

[56] References Cited

U.S. PATENT DOCUMENTS

| | | | |
|---|---|---|---|
| 5,412,245 | 5/1995 | Favreau | 257/530 |
| 5,416,355 | 5/1995 | Kudoh | 257/530 |

FOREIGN PATENT DOCUMENTS 2208962  8/1990  Japan .

OTHER PUBLICATIONS

Takagi et al., "Highly Reliable Metal–to–Metal Antifuse for High Speed Field Programmable Gate Arrays", 1993 IEEE, IEDM 2.7.1–2.7.4.

Cook et al., "A–si Antifuse Tech. for Bipolar PROMS", Bipolar Circuits and Technology Meeting, IEEE, 1986, 99–100.

*Primary Examiner*—Mahshid D. Saadat
*Assistant Examiner*—Valencia Martin Wallace
*Attorney, Agent, or Firm*—Oblon, Spivak, McClelland, Maier & Neustadt, P.C.

[57] ABSTRACT

A programmable device uses anti-fuse elements. The device has a wiring layer on an insulator film on a semiconductor substrate, and it is programmed by connected condition of this wiring. The wiring is separated, such as a first wiring line and a second wiring line on the same plane, beforehand so has been disconnected at separated nodes. A thin insulator film is formed on the disconnection nodes at least, and a further floating electrode, consisting of an aluminum alloy, is formed on the thin insulator film, so that an anti-fuse element is formed straddling the first and the second wiring. When it is programmed, in order to change the disconnected anti-fuse element into a conductive state, a destructive electric potential difference is impressed between the first and the second wiring lines through the thin insulator film. As a result, the thin insulator film is broken, so that the first and the second wiring lines are connected with the floating electrode.

28 Claims, 7 Drawing Sheets

PROGRAMMABLE SEMICONDUCTOR DEVICE USING ANTI-FUSE ELEMENTS WITH FLOATING ELECTRODE

BACKGROUND OF THE INVENTION

1. Field of Invention

The present invention relates to the field of integrated electronic circuit technology. More particularly, the present invention relates to the configuration and manufacturing method of a semiconductor device using anti-fuse elements.

2. The Prior Art

A conventional anti-fuse element consists of one pair of upper and lower wiring conductor layers, and a high resistance film or an insulator film inserted between the wiring conductor layers.

An element constituted by two electrically conductive layers and an insulator film inserted between the electric-conductive layers e.g., used in Field Programmable Gate Arrays (FPGA), is called an "anti-fuse element", because of a feature opposite to general fuse elements, such that the element functions as an insulator during regular operation and can become a connection between the conductive layers upon user activation.

At the initial state, that is the non-programmed state, the anti-fuse element functions as an insulation or high resistance, so that the pair of wirin layers has no connection at the anti-fuse element. After a predetermined destructive electric potential difference is impressed across an anti-fuse element, to create the programmed state, the portion of the wiring conductor layers and the insulator film inserted between the wiring conductor layers melts, and the conductor penetrates the fused insulator film. As a result the anti-fuse element functions as an electrical connection between the upper and lower wiring layers.

Anti-fuse elements have been used for PROMs, such as fuse ROMs and are also used for a FPGA which is a kind of Application Specific Integrated Circuit(ASIC) in recent years.

The Gate Array device has basic cells beforehand on a semiconductor substrate chip. The wirings are designed only after an order from a customer, so the device has the advantage of enabling delivery of the LSI requested by a customer in a short period of time. Since the pattern masks for wiring layers, which wiring pattern is designed on a Computer Aided Design system (CAD), are produced in response to the request of each customer, the cost for mask production per chip will tend to become expensive if the number of pieces ordered by the customer to manufacture is few. The FPGA, which has the feature that the customer can produce the wiring networks without producing his special masks, has been developed in recent years to overcome this cost problem.

The FPGA has basic cells on its chip, and wirings making lines and spaces in each two conductor layers insulated by a dielectric layer respectively, directions of wirings in respective layers are at a right angle, so that the wirings make cross stripes. The insulator layer has holes at the cross points, also referred to as lattice points, between the wiring layers and a thin insulator film is formed in the holes, namely anti-fuse elements are constituted at the cross points. The anti-fuse elements are in a non-connected state because of the thin insulator films between the wiring layers during regular use at a normal electric potential difference. When a predetermined electric potential difference is applied to the thin insulator films in the anti-fuse elements, they change to a conductive state because the upper and the lower wiring layers are connected by an irreversible dielectric breakdown. The FPGA has a tool for impressing the predetermined electric potential difference to anti-fuse elements to break the thin insulator film at arbitrary lattice points on the semiconductor chip.

After packaging the chip, a manufacturer sells them in the non-programmed state. A customer can form the connection between the wiring layers by breaking the thin insulator films of any anti-fuse elements using the tool which impresses the predetermined electric potential difference to the anti-fuse elements, and is able to realize the desired wiring by forming connections at desired anti-fuse elements.

Since the anti-fuse elements formed in the FPGA are included in a logic circuit regularly, a characteristic of such elements which provides quick operation in the circuit is needed. Thus, the characteristics of a conventional anti-fuse element are as follows:

(1) to be connected by the predetermined destructive electric potential difference impression, (2) a minimal leak current in the non-programmed state, (3) low capacitance of the anti-fuse element in the non-programmed state, and (4) low resistance of the connection in the programmed state.

It is very important to realize the good characteristics of the anti-fuse element in order to provide a useful product in the field of FPGA, as well as to build up suitable program algorithms for the anti-fuse elements.

Although many anti-fuse elements become conductive to realize a desired wiring network, namely they are changed over to the programmed state as mentioned above, there are many insulation anti-fuse elements also, that is, in the non-programmed state, which remain on the chip. The insulation anti-fuse elements electrically affect wirings as capacitances in regular use. Therefore, it is necessary to decrease not only both the resistance and the capacitance of wiring lines themselves but also both of the capacitance of the non-programmed anti-fuse elements and the resistance of the programmed anti-fuse elements, in order to realize high-speed signal propagation in the circuit.

The formation process of the conductive path in an anti-fuse element by the dielectric breakdown of the thin insulator film is explained as follows.

When a predetermined destructive electric potential difference is impressed on an anti-fuse element to connect the upper and the lower wiring layers, the current which flows inside of the thin insulator film of the anti-fuse element melts the conductive material wirings and the thin insulator film locally, and the conductive matter flows from one wiring layer toward the other by the power of the electrical field or by the impacts of the electrons along the electric potential. Since the melt point of an insulating material is higher than that of a conductive ingredient of wiring, Generally the insulating material congeals first, and one electrically conductive path of the wiring material through the thin insulator film in the anti-fuse element is formed finally. It is considered that the path of the conductor has a shape which becomes thin gradually from one wiring side toward the other wiring side where the conductive material flows out.

As shown in FIG. 13, U.S. Pat. No. 4,823,181 discloses a typical example of semiconductor apparatus having the conventional anti-fuse element. A lower wiring layer 2 is formed on a base insulator layer 11, such as a silicon oxidation layer, on a silicon semiconductor substrate 1. An insulator layer 3, such as $SiO_2$, is formed by Chemical Vapor Deposition(CVD) on the lower wiring layer 2. A contact hole penetrates through the insulator layer 3 by a method of etching and so on, and the lower wiring 2 is exposed at the bottom of this contact hole. A dielectric anti-fuse film 4, that is a thin insulator or high resistance film, is formed on the exposed lower wiring 2 in the contact hole and on the area around it at least. An upper wiring layer 5 is formed on the insulator layer 3 and on the dielectric anti-fuse film 4. The lower wiring layer 2, the upper wiring layer 5 and the dielectric anti-fuse film 4 between them constitute a conventional anti-fuse element.

A destructive electric potential difference Von, leak current $I_{leak}$ and capacitance C in the non-programmed state, and resistance Ron in the programmed state are expressed as follows:

$$Von = d\ Eon$$

$$C = a\epsilon/d,$$

$$Ron = b\ \rho d,$$

$$I_{leak} = (cV/d)exp((qV/d)^{(1/2)})$$

or $$I_{leak} = c(V/d)^2\ exp(V/d),$$

where $\epsilon$ is the dielectric constant of the dielectric anti-fuse film 4, $\rho$ is the conductivity of the conductive material of wiring layers 2 and 5, d is the thickness of the dielectric anti-fuse film, q is the unit charge, V is the electric potential difference of the regular using condition, Eon is the value of the dielectric breakdown electric field which is constant for an insulator material and a, b, c are constants.

Because the above values are wholly dependent on the thickness d of the dielectric anti-fuse film 4, it is difficult to vary each characteristic value independently, and it is very difficult to make all values suitable since the dependences for the values are different mutually. For example, when the thickness of the dielectric anti-fuse film 4 is increased to decrease the leak current, the resistance in the programmed state and the destructive electric potential difference increase although the capacitance in the non-programmed state decreases. Since the anti-fuse element has the above-mentioned characteristics there is only one fundamental solution to realize the ideal anti-fuse element having all of the desirable destructive electric potential difference, the low resistance in the programmed state, and the low capacitance and no leak current in the non-programmed state. That solution is to change the material of the dielectric anti-fuse film.

Moreover, the wiring design requires a lot of choices generally since logic devices have very complex wiring networks. The aforementioned configuration of the anti-fuse element has a problem that is to restrict the wiring design because the anti-fuse element must use two-layer wiring.

In the aforementioned example, the dielectric anti-fuse film in the anti-fuse element for the FPGA consists of amorphous silicon film or nitride silicon film or metal oxidation film or $SiO_2+Si_3N_4$ film (ON film) or $SiO_2+Si_3N_4+SiO_2$ film (ONO film) and so on. In a case of using ON film or ONO film for the anti-fuse elements, there is required a process of heat oxidation or heat nitriding in order to form a suitable anti-fuse insulator film. Since such a formation process for a suitable anti-fuse film requires raisins the temperature of the environment to about 700–1000 degrees centigrade generally, the manufacturer must choose only special materials which have respective high melt points so as not to melt in the formation process at the high temperature. As a result, the electrodes and wirings placed under the anti-fuse elements can not consist of aluminum which can not bear such an elevated high temperature, and a polycrystalline silicon doped impurity is used instead of aluminum usually. When the conductive path in the anti-fuse element is made from polycrystalline silicon in such a case that both of the upper and the lower wiring layers are formed with polycrystalline silicon, or that only the lower wiring is formed with polycrystalline silicon and the electric field which carries the material from the lower wiring layer toward the upper side makes the dielectric breakdown in the anti-fuse element, the resistance of the path in the anti-fuse element becomes considerably higher (several kilo-ohms) than that of metal (100 ohms typically).

Even if the wirings of upper- and lower-side layers are formed with metal, such as aluminum, when the dielectric anti-fuse film is thick, for example, the thickness of the dielectric anti-fuse film made from amorphous silicon with the method of sputtering becomes about 200 nm, the conductive path created by the dielectric breakdown has the shape becoming thinner along the flowing direction, so that the resistance of the anti-fuse element increases.

Generally, it is required for an anti-fuse element having a specification from customers that the leakage current and the capacitance in the insulating state (the non-programmed state) and the resistance after dielectric breakdown of the dielectric anti-fuse film (in the programmed state) are below predetermined values during normal operation. The specification of these predetermined values also serves to predetermine destructive electric potential difference.

As mentioned above, the conventional anti-fuse element has a first problem that it is difficult to furnish all of the desired destructive electric potential difference to program, low resistance in the programmed state, low capacitance and low leakage current in the non-programmed state at the same time. Second, the degree of freedom for wiring designing is restricted because of the configuration of the two wiring layers to constitute the lattice. It is very important to make the resistance of the anti-fuse element in the programmed state and the capacitance in the non-programmed state smaller in order to operate a logic circuit in the FPGA at high speed.

SUMMARY OF THE INVENTION

An object of the present invention is to provide an improved anti-fuse element to solve the above problems.

Another object of the present invention is to provide an anti-fuse element for which the destructive electric potential difference, that is for programming, can be changeable desirably.

A further object of the present invention is to provide an anti-fuse element having a capacitance which is small, and an anti-fuse element which has a low leak current in the non-programmed state and which has a low resistance only after being programmed.

An additional object of the present invention is to provide an anti-fuse element enabling more choices for designing wiring patterns than the conventional one constituted by two wiring layers.

Theoretically, to vary the material of the dielectric and the thickness of the dielectric anti-fuse film for each anti-fuse element, respectively, increases the number of changeable parameters, so that the degrees of freedom for designing the wiring in an FPGA increases. However the manufacturing process also becomes very complicated. In view of this, a further object of the present invention is to provide an anti-fuse element having many variable parameters without changing the dielectric anti-fuse film for each anti-fuse element and to control characteristics of the anti-fuse element independently.

An additional object of the present invention is to provide a simple manufacturing process of an anti-fuse element having the desired destructive electric potential difference to program, low resistance after the dielectric breakdown, and low capacitance in the non-programmed state simultaneously.

A further object of the present invention is to provide a manufacturing process of an anti-fuse element enabling choices for wiring design.

In order to achieve the objects and in accordance with the purpose of the invention, as embodied and broadly described herein, there is provided an anti-fuse element formed over a substrate. The anti-fuse element comprises an insulator layer formed over a substrate; at least two wiring lines formed on the insulator layer, predetermined portions of the at least two wiring lines being in proximity to each other at a node; a dielectric anti-fuse film formed on the two wiring lines at the node; and a floating electrode formed on the dielectric anti-fuse film to overlap the predetermined portions of the at least two wiring lines at the node, whereby upon application of a destructive electric potential difference across the at least two wiring lines, conductive paths are respectively formed between the floating electrode and each of the at least two wiring lines.

Further in accordance with the present invention, there is provided a process for making an anti-fuse element in a semiconductor device including a semiconductor substrate. The process comprises the steps of forming an insulator layer over the semiconductor substrate; forming on the insulator layer a plurality of wiring lines having predetermined portions in proximity to each other at a node; forming a dielectric anti-fuse film on the plurality of wiring lines at the node; and forming a floating electrode on the dielectric anti-fuse film to overlap the predetermined portions at the node.

Further in accordance with the present invention, there is provided a process for changing a state of an anti-fuse element, which includes a plurality of wiring lines in proximity to each other on an insulator layer on a substrate at a node, a dielectric anti-fuse film on the plurality of wiring lines at the node and a floating electrode on the dielectric anti-fuse film and overlapping predetermined portions of the plurality of wiring lines at the node. The process comprises the steps of impressing a predetermined electric potential difference between a first wiring line and a second wiring line of the plurality of wiring lines at the node, resulting in division of the predetermined electric potential difference into a first electric potential difference between the first wiring line and the floating electrode and a second electric difference between the second wiring line and the floating electrode; breaking down the dielectric anti-fuse film between the first wiring line and the floating electrode with the first electric potential difference and forming a conductive path between the first wiring line and the floating electrode; and impressing, after the breaking step, the predetermined electric potential difference across the dielectric anti-fuse film between the second wiring line and the floating electrode.

The numerals given in the figures show that 1-semiconductor substrate, 2-first wiring, 4,7-anti-fuse film such as a thin insulator film or thin high resistance.film, 71-conductive path, 5-second wiring, 6-wiring layer, 60-wiring layer, 61-first wiring line, 62-second wiring line, 63-third wiring line, 10-floating electrode, 11-insulator layer.

DETAILED DESCRIPTION OF THE INVENTION

Figure 1:
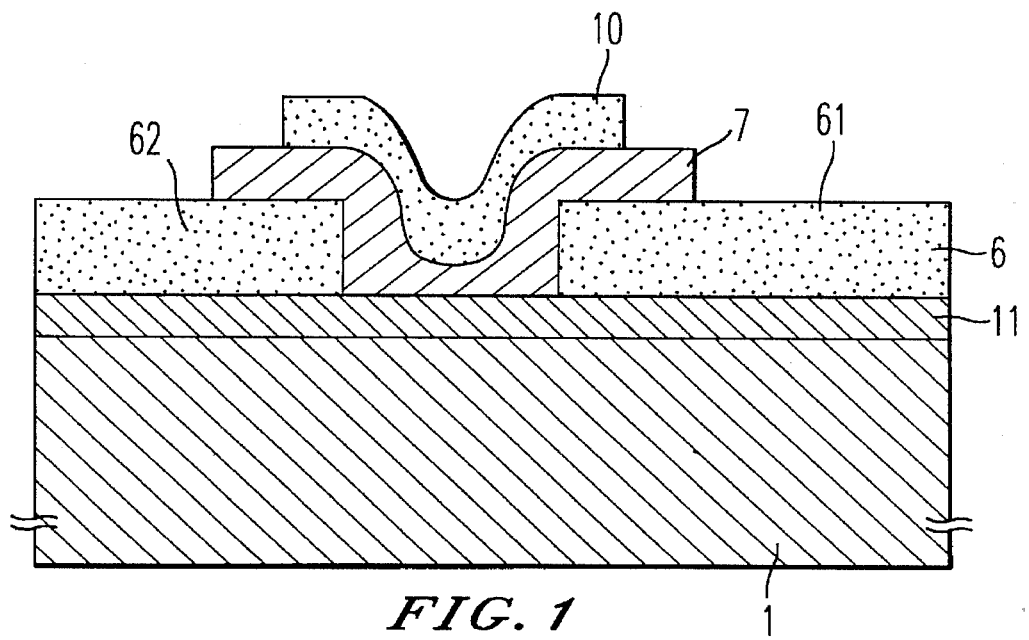
FIG. 1 is a partial sectional view of an anti-fuse in a first example of the present invention.
Figure 2:
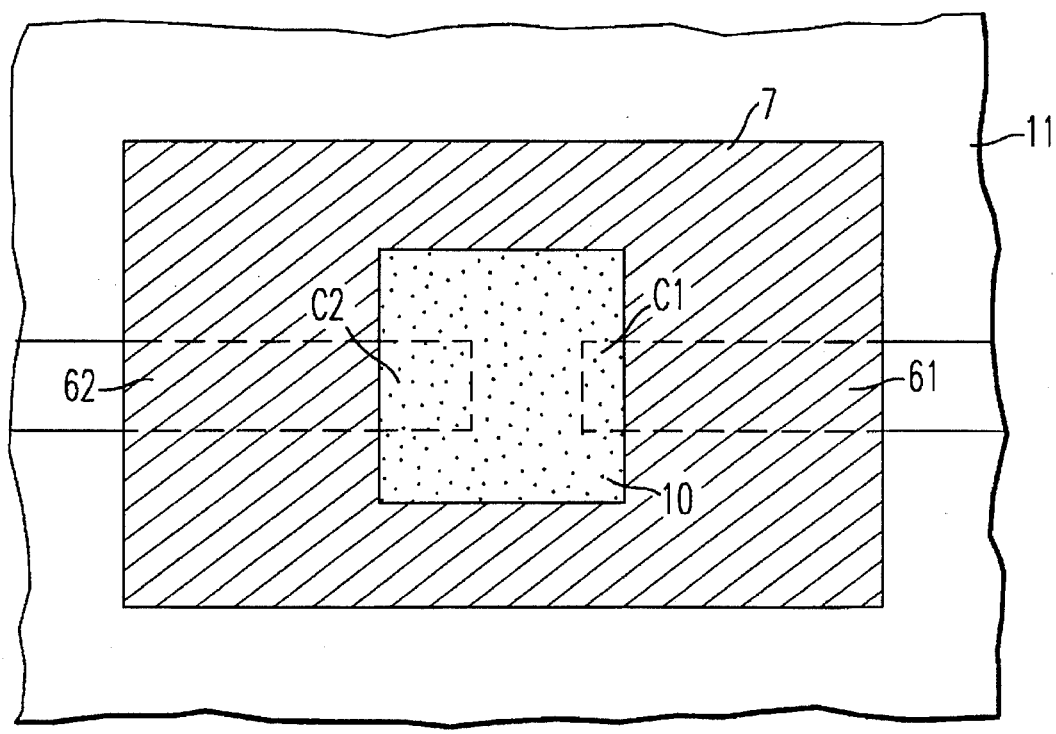
FIG. 2 is a plan view of the anti-fuse element in the first example of FIG. 1.
Figure 3:
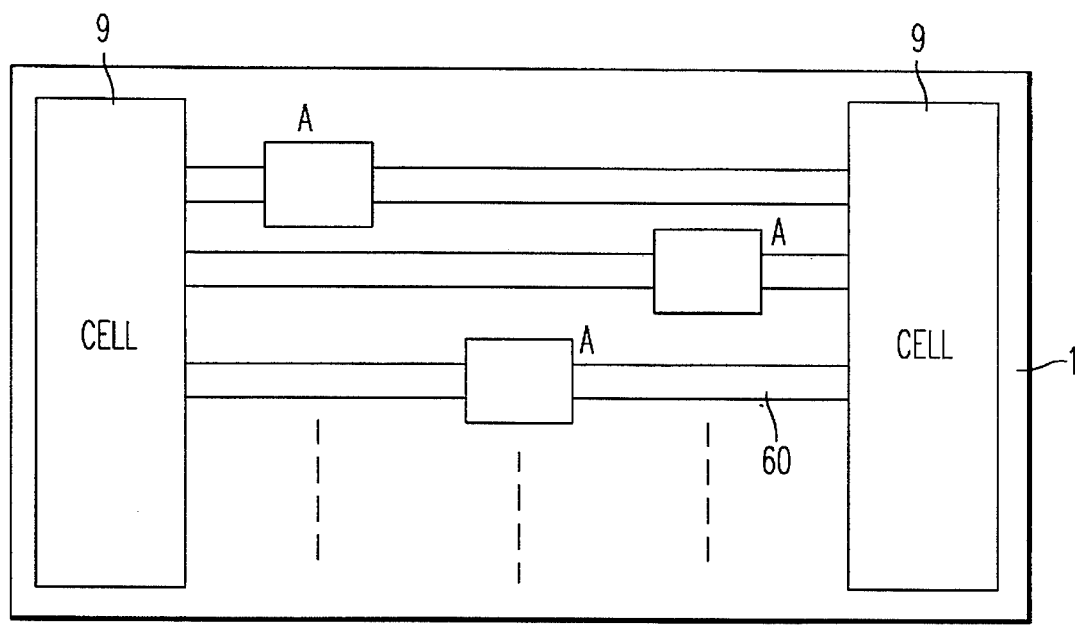
FIG. 3 is a plan view of the anti-fuse element in the first example.
Figure 4:
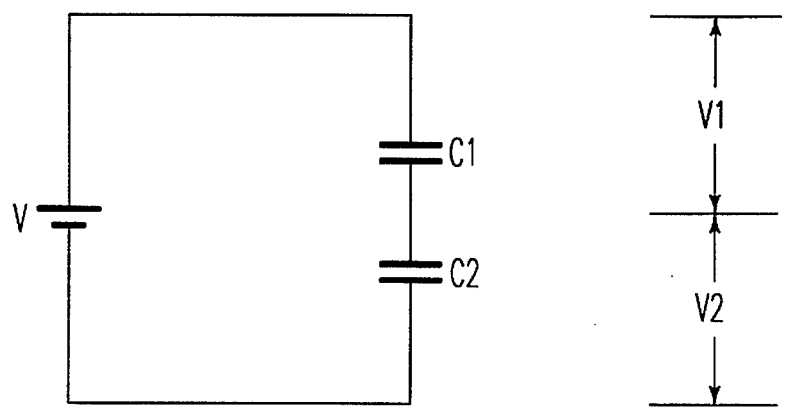
FIG. 4 illustrates an equivalent-circuit of an anti-fuse element according to the present invention.

The first example is explained with reference to FIG. 1 to FIG. 4. FIG. 1 shows a partial sectional view of the present anti-fuse element, in the cross section of a semiconductor device, FIG. 2 is a plan view of FIG. 1, FIG. 3 is a partial plan view of the semiconductor device using anti-fuse elements according to this example and FIG. 4 is an equivalent-circuit of a dielectric anti-fuse element according to the present invention.

First an insulator layer 11 formed of a material, such as silicon oxide film, is formed on a substrate 1 which has semiconductor components, such as transistors or diodes, on its surface. The insulator layer 11 can be formed on any substrate which is not made of semiconductor, or on the semiconductor substrate 1 without mediums or on layers disposed on the semiconductor substrate 1. A wiring layer 6 composed of, for example, Al—Si—Cu, is formed on the insulator layer 11. This wiring layer 6 is divided into a first wiring line 61 and a second wiring line 62 on the same plane, and the tips of these wiring lines kept at a predetermined spacing.

A dielectric anti-fuse film 7, that is formed by a thin insulator film or a high resistance film, such as $Si_3N_4$, and disposed over the predetermined spacing so as to at least coat both of the tips of the wiring lines. A floating electrode 10 composed of, for example, Al—Si—Cu, which keeps floating electric potential from both of the first and the second wiring lines, is formed on the dielectric anti-fuse film 7 over the predetermined spacing. The predetermined spacing needs a larger distance than the thickness of the dielectric anti-fuse film 7 at least, for example, it is about 0.5–1.0 μm.

The floating electrode 10 overlaps over the tips of the first and second wiring lines, the overlap area over the tip of the first wiring line forming capacitance $C_1$ and that over the tip of the second wiring line a capacitance $C_2$.

The anti-fuse element of the first example of the present invention has a configuration such as shown in FIG. 1 and FIG. 2 at a node. Although there is a depression in the anti-fuse element between the tips of the wiring lines in this example, this depends only upon the process for depositing the dielectric anti-fuse film 7 and the floating electrode 10 on the tips of the wiring lines.

FIG. 3 illustrates a partial plan view of a semiconductor device having two or more of the present anti-fuse elements. Anti-fuse elements A are formed on the wiring 60 between cells 9, where a cell represents one of a MPU, ROM, RAM, a logic block, and the other functional blocks. The wiring 60 can be formed as the first Al wiring layer of multi-wiring layers or a higher one of such multi-wiring layers such as the second Al wiring layer or the third Al wiring layer on the substrate 1.

The anti-fuse elements in the FPGA are insulated, that is, in the non-programmed state, in the initial state. The user impresses a predetermined electric potential difference to the desired anti-fuse elements to break the anti-fuse film 7 inserted between the first and the second wiring lines 61, 62 and the floating electrode 10 in the anti-fuse elements, so that conductive paths 71 (FIG. 6) are formed and desired anti-fuse elements chance to the programmed state after the user obtains the FPGA.

The process of the dielectric breakdown of the anti-fuse element and of formation of the conductive path is explained as follows.

Figure 6:
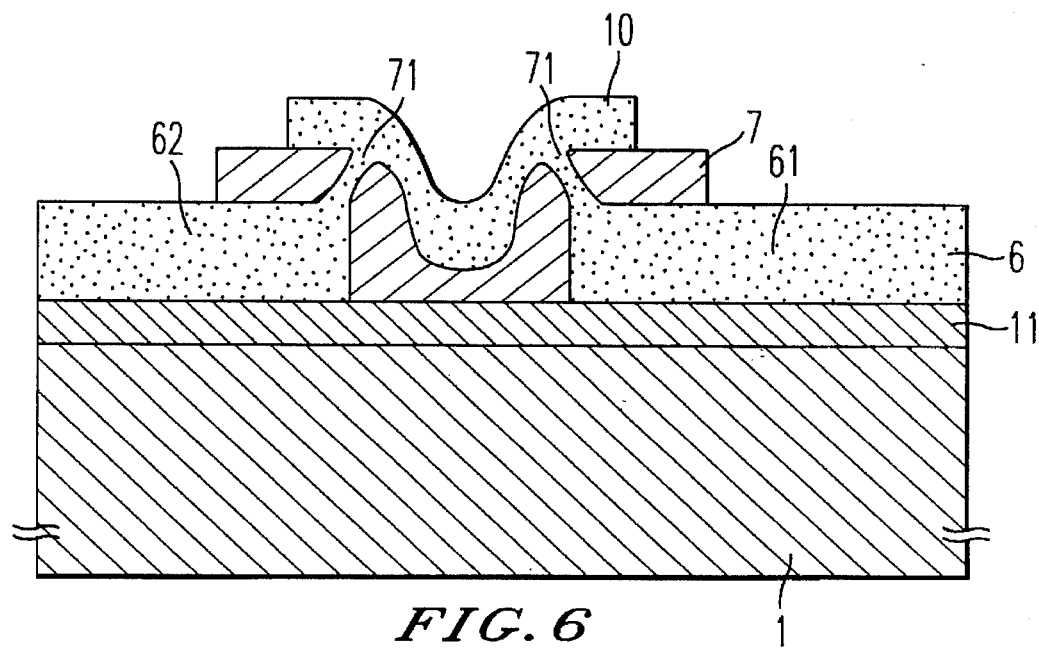
FIG. 6 is a partial sectional view of the conductive anti-fuse element (in programmed state) in the first example of the present invention.

When one or more pulses having a predetermined electric potential difference, for example, 12 MV/cm for some millisecond, are applied between the first wiring line 61 and the second wiring line 62, a high electric field ill arise both between the tip of the first wiring line 61 and the floating electrode 10, and between the floating electrode 10 and the tip of the second wiring line 62 simultaneously. For the high electric field, the dielectric anti-fuse film 7 inserted between the floating electrode 10 and both of the first wiring line 61 and the second wiring line 62 is broken, a current flows locally and melts the electric-conduction ingredient constituting the tips of the first and the second wiring lines 61, 62 and the dielectric anti-fuse film 7. The melted electric-conductive ingredient flows toward the one wiring side from the other side by the force along the electric field or the impacts of the electrons moving along the electric field. Generally, since a melting point of an insulator material is higher than that of a conductive material, the insulation material of the dielectric anti-fuse film 7 freezes prior to freezing of the ingredient of the wiring lines 61, 62 and the floating electrode 10. As shown in FIG. 6, an electric conductive path 71 is ultimately formed in the dielectric anti-fuse film In this example both of the first wiring line 61 and the second wiring line 62 are formed on the same plane surface on the semiconductor substrate 1, and the floating electrode 10 laps over both of the tips of the first and the second wiring line 61, 62. Although there is a depression between the tips of the first and the second wiring line 61, 62, the anti-fuse element does not need it. The depression naturally result from the space between the tips.

The destructive electric potential difference for the dielectric breakdown, the resistance of the conductive anti-fuse element and the capacitance of the insulated anti-fuse element become independent because of a newly introduced parameter, that is, the ratio of the overlap areas which are constituted by the first wiring line 61 and the floating electrode 10, and the floating electrode 10 and the second wiring line 62.

FIG. 4 is an equivalent circuit diagram which illustrates a fundamental operation of the present invention.

When the floating electrode 10 is disposed on the dielectric anti-fuse film 7 on both of the first wiring line 61 and the second wiring line 62 on one plane, the overlap areas form the capacitances between the first wiring line 61 and the floating electrode 10, and between the second wiring line 62 and the floating electrode 10. If the dielectric anti-fuse film has the predetermined dielectric-constant ε and the thickness they are constant for each of the capacitances, and the following equations for the whole capacitance C of the anti-fuse element can be expressed:

$$C = C_1 C_2 / (C_1 + C_2)$$

$$= (\epsilon/d)(S_1 S_2 / (S_1 + S_2)),$$

where $S_1$ expresses the area of the overlapping parts of the first wiring line 61 and the floating electrode 10, $S_2$ the area of the overlapping parts of the second wiring line 62 and the floating electrode 10, and $C_1$ and $C_2$ are the capacitances of the overlapping parts, respectively. Thus, the total capacitance C is divided into $C_1$ and $C_2$, and each capacitance $C_1$ or $C_2$ can be varied by changing each overlap area independently.

In the anti-fuse element shown in FIG. 4, the partition ratio of the two capacitors $C_1$ and $C_2$ decides the share of the electric potential difference V which is the whole electric potential difference impressed between the first and the second wiring lines 61, 62. $V_1$ and $V_2$ are the electric potential differences across the capacitances $C_1$ and $C_2$, respectively. Namely, $$V_1 = (C_2/(C_1 + C_2))V,$$

$$V_2 = (C_1/(C_1 + C_2))V.$$

If $V_1/d$ or $V_2/d$ exceeds the destructive electric field Eon for the dielectric anti-fuse film 7, the capacitor $C_1$ or $C_2$ will break down. After one of the capacitors has broken down, the whole impressed electric potential difference V is applied across and breaks down the other remaining capacitor in succession, so that the path of the first wiring line 61 —the conductive path 71—the floating electrode 10—the conductive path 71—the second wiring line 62 is formed and the anti-fuse element becomes conductive. The ratio $C_1/C_2$ changes the ratio $V_1/V_2$, so the electric potential difference concerning each capacitor changes to arbitrary values between 0 to V. If at least one of $V_1$ and $V_2$ exceeds the destructive electric potential difference $V_{on} = d \times Eon$, the anti-fuse element changes to conductive. If the capacitor $C_1$ receives the larger electric potential difference ($V_1 > V_2$), $V_1$ exceeds $V_{on}$ first, and if $V_1 < V_2$, $V_2$ does so first, so that the maximum whole destructive electric potential difference is $2 \times V_{on}$. If it is desired to reduce the whole destructive electric potential difference, it is enough to change the ratio of the capacitors $V_1/V_2$ and to have one of the capacitor receive the larger electric potential difference.

The electric potential difference impressed on the dielectric anti-fuse film 7 of the present anti-fuse element is smaller than that of the conventional anti-fuse in the regular use state because of the sharing of the electric potential difference between the capacitors, so that the dielectric anti-fuse film 7 of the present anti-fuse element can be thinner than that of the conventional one. Therefore the resistance in the conductive state (in the programmed state) of the anti-fuse element Ron is decreased favorably.

As mentioned above, since the numbers of the variable parameters increases, the characteristics of the anti-fuse element can be vary independently. Furthermore, since the anti-fuse element utilizes one wiring layer on the same plane and the floating electrode over the wiring only, this anti-fuse element has more choices for designing a wiring pattern than the conventional one which is placed and connects at the cross points of two wiring layers to program.

A method for manufacturing an anti-fuse element according to the invention is described next with reference to FIGS. 5(a)–5(c).

Figure 5A:
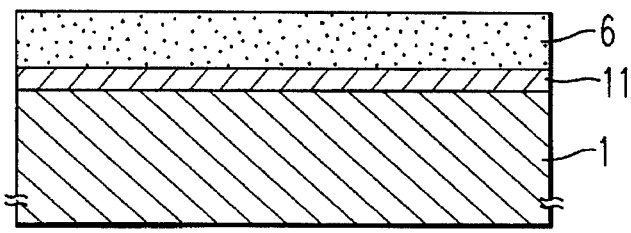
FIGS. 5(a)–(c) are a series of sectional views of the anti-fuse element in the first example of the present invention to illustrate a manufacturing process.
Figure 12:
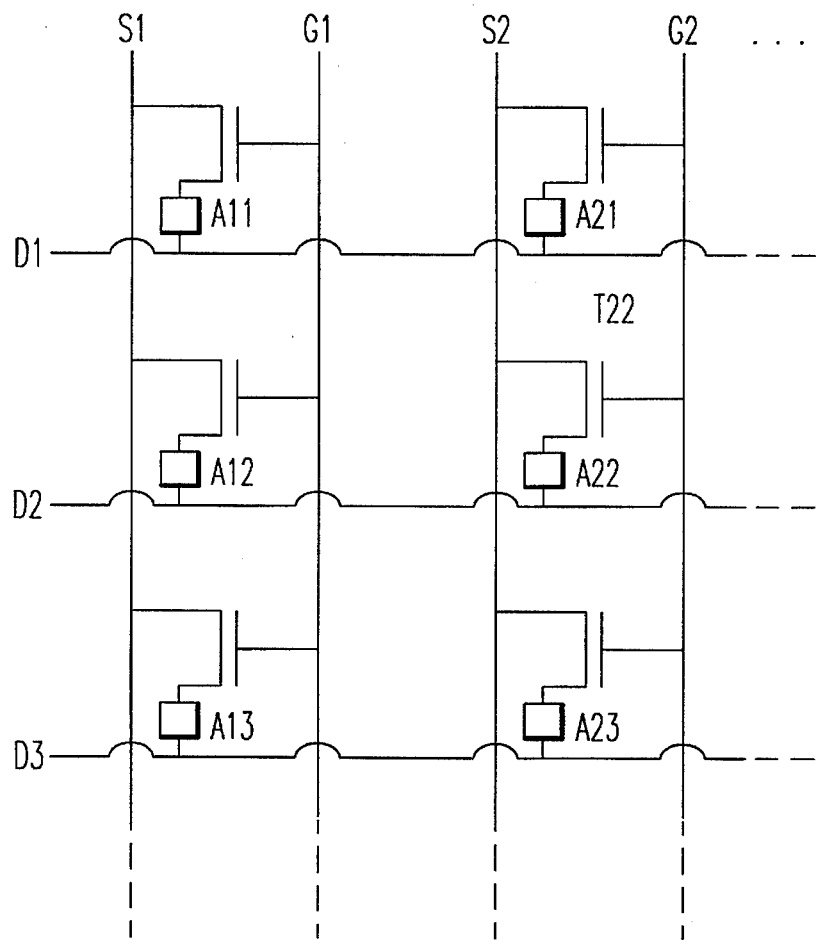
FIG. 12 illustrate an anti-fuse element in a memory device, in a sixth example of the present invention.
Figure 13:
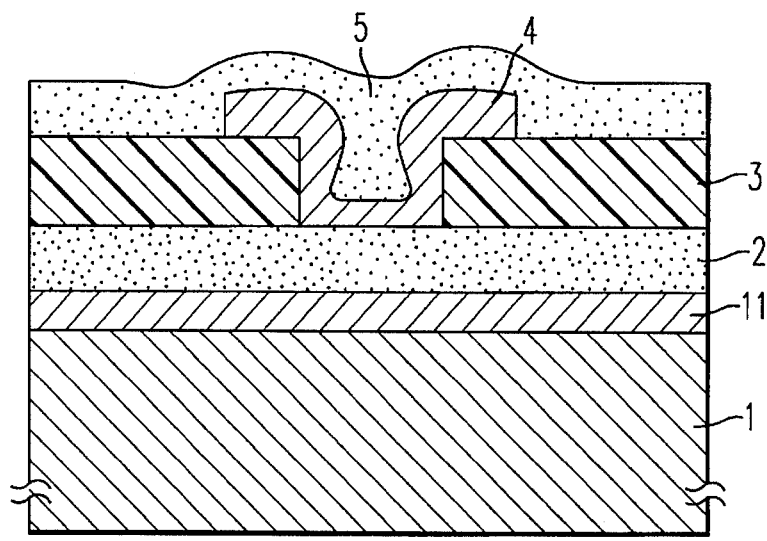
FIG. 13 is a sectional view of a conventional anti-fuse element in a semiconductor device.

With reference to FIG. 5(a), semiconductor components, such as MOS transistors or diodes schematically shown, for example, in FIG. 12, are formed on the silicon semiconductor substrate 1 by a typical process, and an insulator layer 11, such as $SiO_2$, is formed on the substrate 1 and may be formed over the transistors. A wiring layer 6, such as an aluminum alloy layer which consists of Al—Si—Cu, is formed with a thickness of about 600 nm on the substrate 1, for example, by a conventional sputtering process. A desired wiring pattern is copied on to the wiring layer 6 from a designed pattern mask having a predetermined wiring pattern.

Figure 5B:
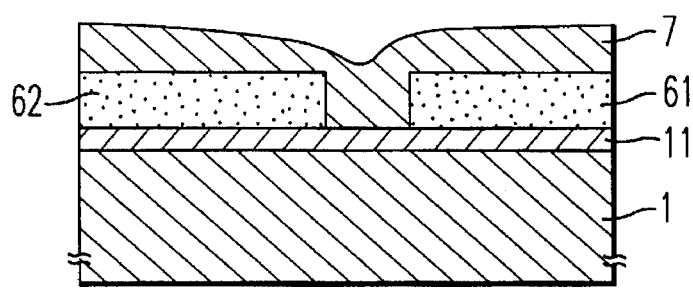
Figure 5C:
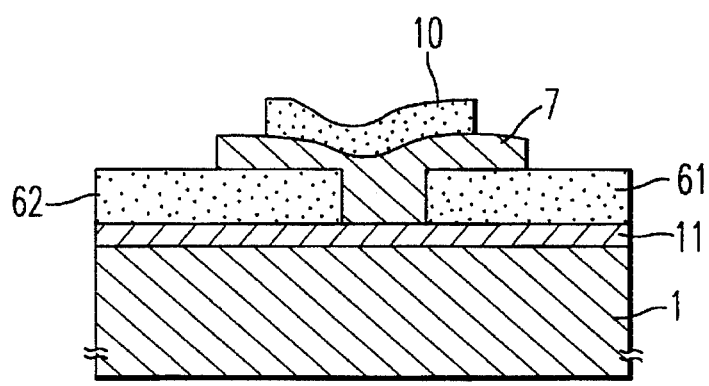

Subsequently, as shown in FIG. 5(b), a first wiring line 61 and a second wiring line 62 having tips spaced apart are formed from the wiring layer 6 at a reserved area for an anti-fuse element by using anisotropic etching such as Reactive Ion Etching(RIE). As previously noted, the spacing between the tips of wiring lines 61 and 62 can be about 0.5–1.0 µm. A dielectric anti-fuse film 7, for example, consisting of $Si_3N_4$ is formed with a thickness of about 300 nm at least on both of the first and the second wiring line 61, 62 by a plasma Chemical Vapor Deposition (CVD) process, etc. Next, as shown in FIG. 5 (c), an aluminum alloy layer such as Al—Si—Cu layer is formed with a thickness of about 400 nm on the dielectric anti-fuse film 7 by the sputtering method, and a floating electrode 10 over both of the tips of the first and the second wiring line 61, 62 is formed from the aluminum alloy layer on the dielectric anti-fuse film 7 by an etching method like RIE. At this time, the floating electrode 10 overlaps only predetermined areas over the tip of the first wiring line 61 and of the second wiring line 62 so that predetermined capacitances $C_1$ and $C_2$ may be formed between the first wiring line 61 and the floating electrode 10 and between the second wiring line 62 and the floating electrode 10, respectively. As a result, an anti-fuse element is formed.

Followed the above steps, an insulated protection film is deposited on these layers, or an insulator layer and a wiring layer are deposited thereon so that a multilayer wiring configuration is formed.

The floating electrode 10 consists of doped polycrystalline silicon, or amorphous silicon, or a low resistance metal such as TiN, Al, Cu, or a high melt point metal such as W, Ti, Mo, or an alloy of these metals, or a single or compound of a silicide layer. The dielectric anti-fuse film 7 between the floating electrode 10 and both of the first and the second wiring lines 61, 62 consists of dielectrics composed of one or more elements in Si, O, N, or further added H, F, Cl etc., or undoped amorphous silicon, or undoped polycrystalline silicon, or a metal oxidation film such as Cu, Ti, W, Mo oxide.

The anti-fuse element provided in accordance with the present invention has merits described below.

Generally, it is required for an anti-fuse element, for example by customer specification, that the leakage current and the capacitance with an electric potential difference of usual operation in the insulating state (the non-programmed state), and the resistance after dielectric breakdown of the dielectric anti-fuse film (in the programmed state) are below predetermined values, and that the destructive electric potential difference has a predetermined value. An anti-fuse element provided in accordance with the invention and having desired characteristics can be obtained more easily since it has a greater number of parameters which can be varied independently. Namely the anti-fuse element according to the present invention having an overlap area of the first wiring line 61 or the second wiring line 62 and the floating electrode 10 which can be changed, has an advantage to enable design of the wiring pattern very easily.

In accordance with the present invention, because the floating electrode 10 is formed on the dielectric anti-fuse film 7 accumulated on the tips of the first and the second wiring lines 61, 62, the destructive electric potential difference, that is the program electric potential difference, can be changeable desirably and the capacitance of the anti-fuse element can be made small in the non-programmed state simultaneously, by changing the overlapping areas.

Since the present anti-fuse element only needs one wiring layer, the degrees of freedom for wiring design can be increased.

Moreover, since the dielectric anti-fuse film of the present anti-fuse element can be formed thinner than that of the conventional element, the anti-fuse element can have low resistance after the dielectric breakdown, so that it realizes a high-speed FPGA.

Furthermore, the present anti-fuse element can minimize leakage current and have low capacitance in the non-programmed state.

Although explained with respect to the configuration and operation of FPGA above, the present anti-fuse element is not applied only to FPGAs. It is also applicable to semiconductor apparatus of other kinds. For example, since the anti-fuse element can be converted irreversibly to a programmed state, it can act as an opposite operation fuse electrically such as in a fuse ROM in a PROM.

Figure 7:
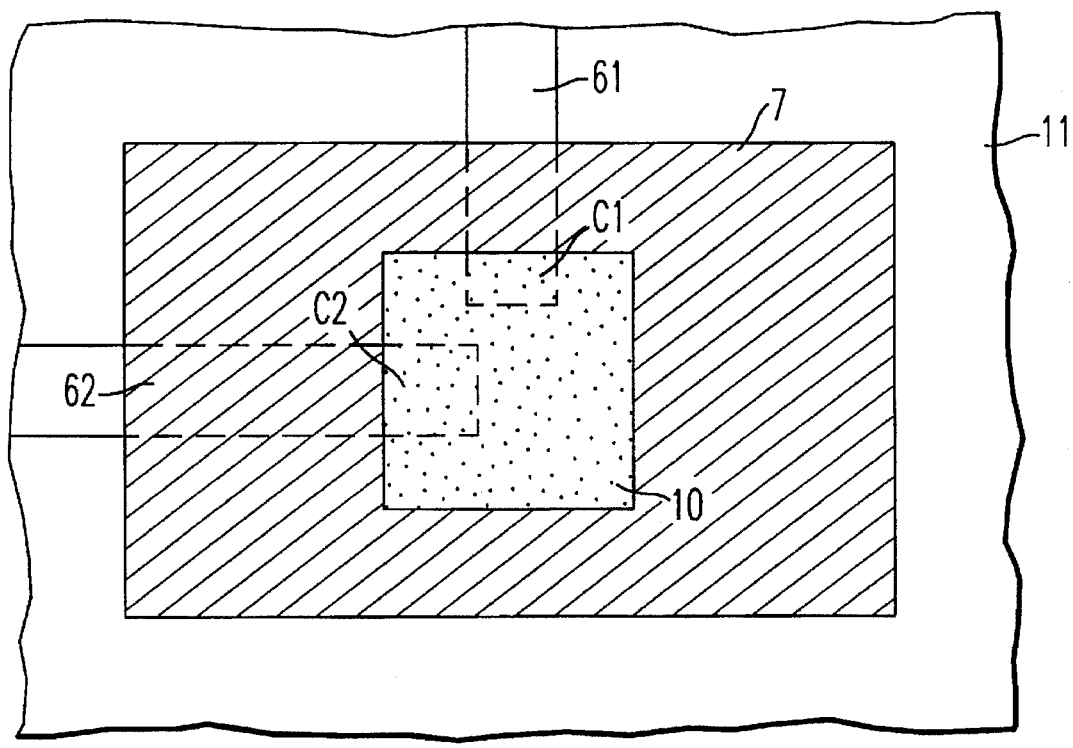
FIG. 7 is a partial plan view of an anti-fuse element in a second example of the present invention.

A second example is explained with reference to FIG. 7. FIG. 7 is the plan view of the present anti-fuse element on a substrate 1. Although the first wiring line 61 and the second wiring line 62 are formed on one straight line in the first example, now they are not on a straight line but approximately constitute a right angle therebetween in this second example. Therefore, the anti-fuse element functions as a programmable element and is able to change the direction of wiring lines at the same time.

As indicated in this second example, a first wiring line 61 and a second wiring line 62 are formed making a right angle at a node planned to constitute an anti-fuse element on the insulator layer 11 on the substrate 1, and a dielectric anti-fuse film 7 and a floating electrode 10 are piled on the tips of the first and the second wiring lines 61, 62 at least. As a result, the floating electrode 10 and the tip of the first line 61, and the tip of the second line 62 form capacitances $C_1$ and $C_2$, respectively.

The floating electrode 10 consists of doped polycrystalline silicon, or amorphous silicon, or low resistance metal such as TiN, Al, Cu, or high melt point metal such as W, Ti, Mo, or an alloy of these metals, or sinRle or compound of silicide layer. The dielectric anti-fuse film 7 between the floating electrode 10 and both of the first and the second wiring layer 61, 62 consists of dielectrics composed of one or more elements in Si, O, N, or further added H, F, Cl etc., or undoped amorphous silicon, or undopad polycrystalline silicon, or a metal oxidation film such as Cu, Ti, W, Mo oxide.

The anti-fuse element of the second example has the merits described above with respect to the first example. Additionally, the anti-fuse element of the second example provides the further design flexibility of enabling provision of such an element at a location where two wiring lines meet at approximately 90 degrees.

Figure 8:
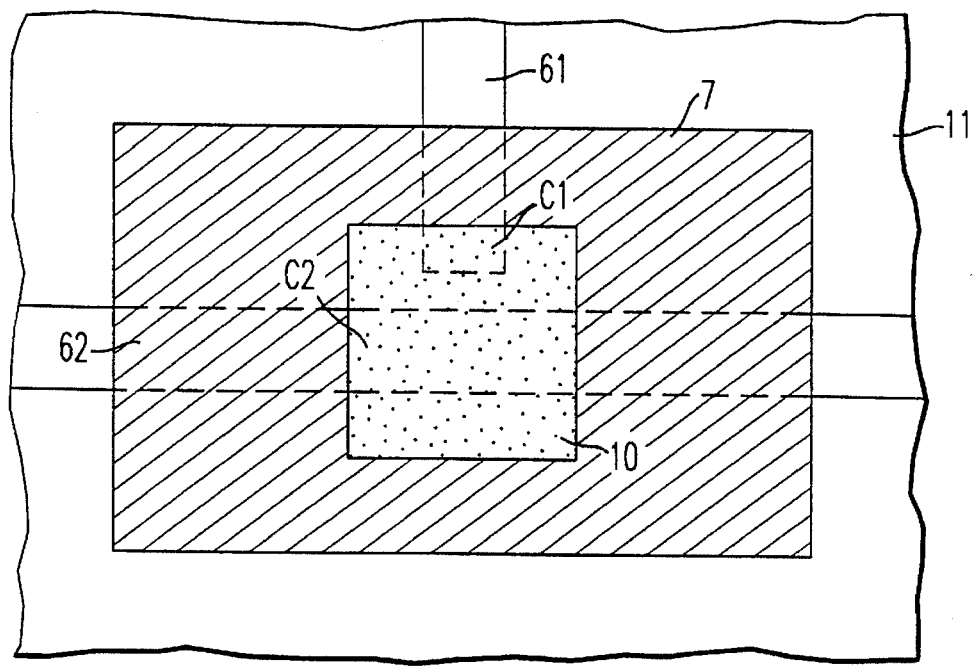
FIG. 8 is a partial plan view of an anti-fuse element in a third example of the present invention.

A third example of the present invention is explained with reference to FIG. 8. FIG.8 shows a partial plan view of a anti-fuse element on the substrate 1. Although the first wiring line 61 and the second wiring line 62 are formed along one straight line in the first example, now they are not alone a straight line. Instead, the second wiring line 62 runs straight and the tip of the first wiring line 61 is placed separately at approximately a right angle to line 62 at the anti-fuse element node. Therefore, this anti-fuse element functions as both a programmable element and a changeable wiring system.

A tip of the first wiring line 61 is formed spaced approximately perpendicular to a second wiring line 62 running straight at a node for the anti-fuse element on the insulator layer 11 on the substrate 1. An anti-fuse film 7 and a floating electrode 10 are disposed, in that order, on the tip of the first wiring line 61 and at least a portion of the second wiring line 62 proximate the tip of the first wiring line 61. The overlap area of the floating electrode 10 and the tip of the first line 61, and the overlap area of the floating electrode 10 and the second line 62 form the capacitances $C_1$ and $C_2$, respectively.

In the third example, the floating electrode 10 and the dielectric anti-fuse film 7 can be formed from the same materials as described above with respect to the first and second examples.

The anti-fuse element of the third example has the merits described above with respect to the first and second examples.

Additionally, because the floating electrode 10 consists of conductive material and is formed on the dielectric anti-fuse film 7 accumulated on the tip of the first wiring line 61 and the proximate portion of the second wiring line 62, the destructive electric potential difference, that is the program electric potential difference, can be changeable desirably and the capacitance of the anti-fuse element can be made small in the non-programmed state simultaneously.

Figure 9:
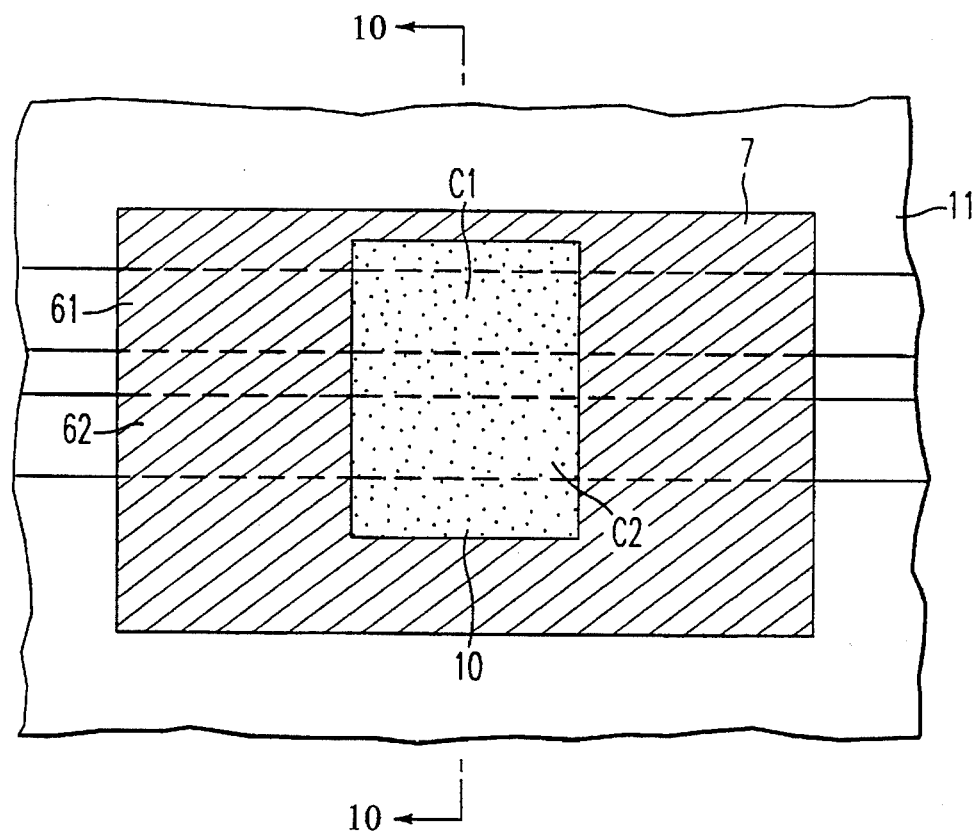
FIG. 9 is a partial plan view of an anti-fuse element in a fourth example of the present invention.
Figure 10:
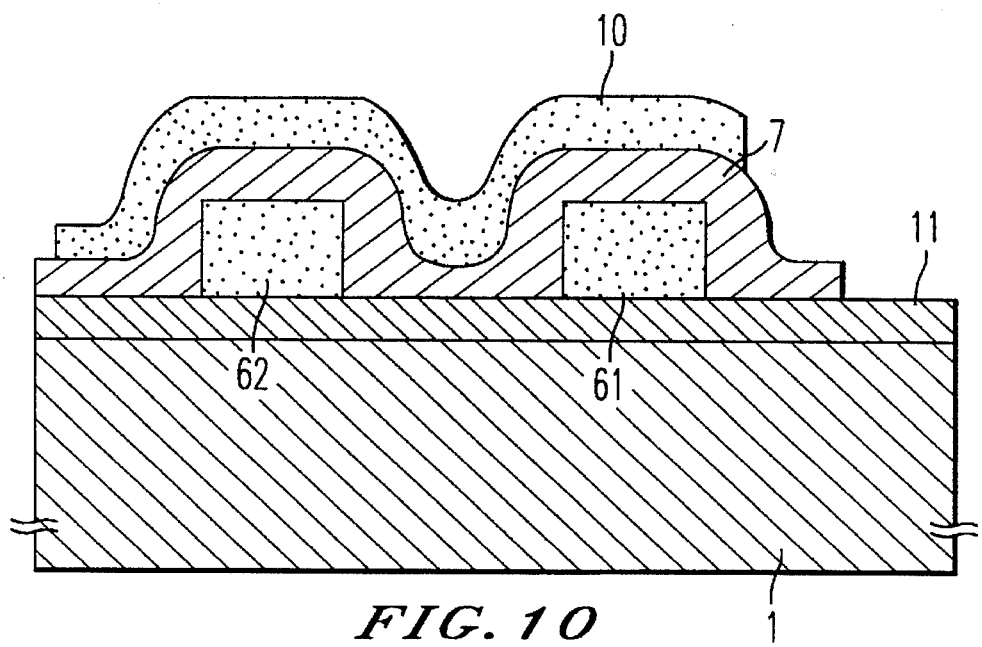
FIG. 10 is a partial sectional view of an anti-fuse element in the fourth example of the present invention taken along line A—A in FIG. 9.

A fourth example is explained with reference to FIG. 9 and FIG. 10. FIG. 9 shows the partial plan view of an anti-fuse element on the substrate 1, FIG. 10 shows a partial sectional view of the anti-fuse element taken along line A—A in FIG. 9. Although the first wiring line 61 and the second wiring line 62 are formed along one straight line in the first example, they are not formed along one straight line in the fourth example. Instead, the first and the second wiring lines 61, 62 run parallel to each other having a distance therebetween at least at the location of the anti-fuse element. Therefore, this anti-fuse element functions as programmable element, while enabling a changeable wiring system at the same time.

The first wiring line 61 and the second wiring line 62 are formed as a pair of parallel lines spaced at a node for the anti-fuse element on the insulator layer-11 on the substrate 1, and the anti-fuse film 7 and the floating electrode 10 are disposed, in that order, on at least respective portions of the first and the second wiring lines 61, 62 to form the anti-fuse element. The overlap area of the floating electrode 10 and the first wiring line 61, and the overlap area of the floating electrode 10 and the second wiring line 62 form capacitances $C_1$ and $C_2$, respectively.

As shown in FIG. 10, the floating electrode 10 is disposed on the dielectric anti-fuse film 7 over the first and the second wiring lines 61, 62. When the destructive electric potential difference is impressed between the first and the second wiring lines 61, 62, conductive paths are formed among the first wiring line 61—the floating electrode 10—the second wiring line 62, as shown in FIG. 6

The floating electrode 10 and the dielectric anti-fuse film 7 between the floating electrode 10 and both of the first and the second wiring lines 61, 62 can be formed from the same materials as described above with respect to the first, second, and third examples.

The anti-fuse element of the fourth example has the merits described above with respect to the first, second and third examples.

Additionally, because the floating electrode 10 consisting of conductive material is formed on the dielectric anti-fuse film 7 accumulated over the proximate portions of the first and the second wiring lines 61, 62, the destructive electric potential difference, that is the program electric potential difference, can be changeable desirably and the capacitance of the anti-fuse element can be made small in the non-programmed state simultaneously.

Figure 11:
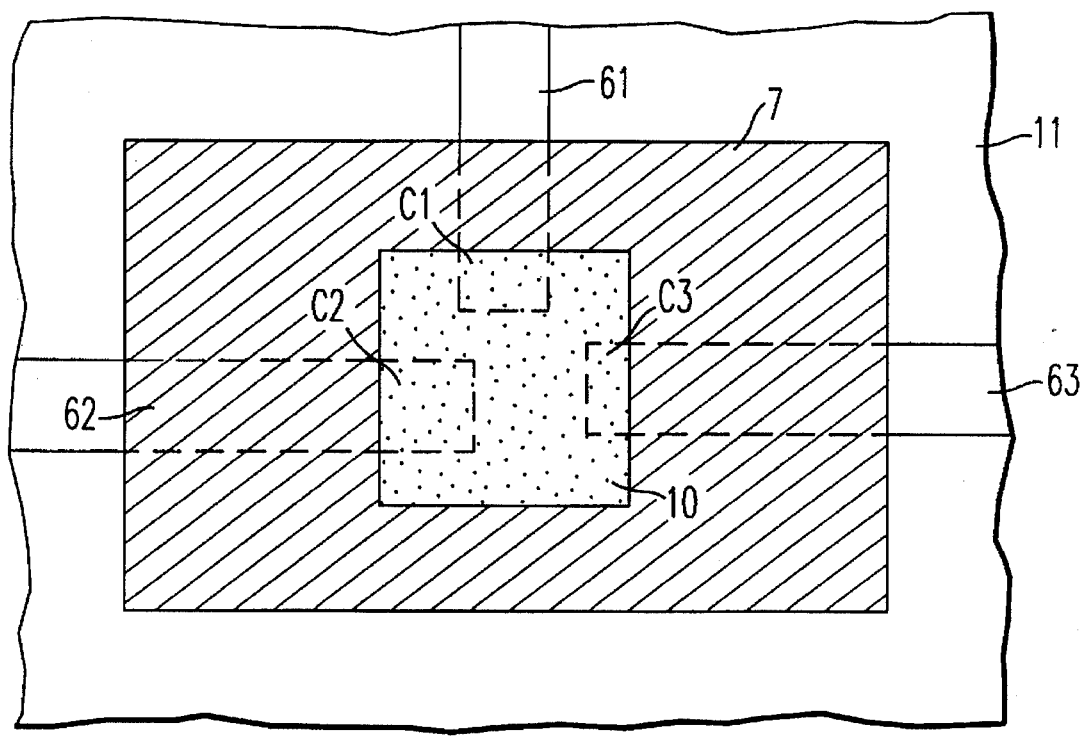
FIG. 11 is a partial plan view of an anti-fuse in a fifth example of this present invention.

A fifth example is explained with reference to FIG. 11. FIG. 11 shows a partial plan view of the anti-fuse element of the fifth example on a substrate 1. Although the first wiring line 61 and the second wiring line 62 are formed along one straight line in the first example, now a third wiring line 63 is added in this fifth example. Therefore, this anti-fuse element functions as a programmable element, while enabling a changeable wiring system at the same time.

The first wiring line 61, the second wiring line 62 and a third wiring line 63 are formed and the tips of these lines are in proximity to each other at a node for the anti-fuse element on the insulator layer 11 on the substrate 1, the anti-fuse film 7 and the floating electrode 10 are disposed, in that order, on at least the tips of the first, the second and the third wiring lines 61, 62, 63 to form the anti-fuse element. The overlap area of the floating electrode 10 and the first wiring line 61, the second wiring line 62, and the third wiring line 63 form capacitances $C_1$, $C_2$ and $C_3$ respectively.

In this example, it is possible to selectively connect any two wiring lines of the three wiring lines 61, 62, 63, or connect all three wiring lines at the anti-fuse element simultaneously. For example, when the first and the third wiring lines 61, 63 are selectively connected, the destructive electric potential difference is impressed between the first and the third wiring lines 61, 63 and the second wiring line 62 is held at an intermediate electric potential between the destructive electric potential and a reference potential or floating, so that the conductive paths are only formed between the first and the third wiring lines 61, 63 through the floating electrode 10 and the second wiring line 62 remains insulated therefrom. When all three wiring lines are connected at the anti-fuse element, the destructive electric potential difference is impressed between one of the three wining lines 61, 62, 63 and the other two wiring lines.

Since the three wiring lines are in proximity to each other at a node for the anti-fuse element in this example, more wiring lines can be formed at a node and they can be connected selectively.

The floating electrode 10 and the dielectric anti-fuse film 7 between the floating electrode 10 and both of the first and the second wiring lines 61, 62 can be formed of the same materials as described above with respect to the first, second, third, and fourth examples.

The anti-fuse element of the fifth example has the merits described above with respect to the first, second, third, and fourth examples.

Additionally, because the floating electrode 10 is formed on the dielectric anti-fuse film 7 accumulated over the tips of the first, the second, and the third wiring lines 61, 62, and 63, over the destructive electric potential difference, that is the program electric potential difference, can be changeable desirably and the capacitance of the anti-fuse element can be made small in the non-programmed state simultaneously.

A sixth example is an example of applying anti-fuse elements according to the present invention to a memory device. FIG. 12 illustrate a partial plan view of an EPROM having anti-fuse elements of the present invention on a silicon semiconductor substrate.

The bit lines (D1, D2, D3 . . .) and the word lines (G1, G2, G3 . . .) are formed in a matrix configuration, and a memory component is formed at intersections of the bit and word lines. Between the respective gate lines, source lines (S1, S2, S3 . . .) are formed in parallel. Anti-fuse elements (A11, A12, A21 . . .) are formed between the drain of each memory component and the associated bit line. In this memory device, an anti-fuse element in the programmed state(ON) means "1" and in the non-programmed state(OFF) means "0".

For example, when it is desired to change anti-fuse element A22 to the programmed state (ON), the source line S2 is maintained at 0 V(ground) and the Vpp (destructive electric potential difference) is applied to the bit line D2. The transistor T22 of the memory component corresponding to element A22 is turned on by impressing an electric potential difference more than its threshold value Vth to the gate line G2. In reading the programmed EPROM memory, keeping the source lines (S1, S2, . . .) to 0 V(ground) and the bit lines (D1, D2 . . .) to a reading electric potential difference(5 V), the drain currents of the transistors of the memory components or the electric potentials of the bit lines are observed as the transistors turn on by impressing the word lines (G1, G2 . . .) one after another.

Since the present anti-fuse element only needs one wiring layer, the degrees of freedom for wiring design can be increased.

Moreover, since the dielectric anti-fuse film of the present anti-fuse element can be formed thinner than that of the conventional element, the anti-fuse element of the invention can have low resistance only after the dielectric breakdown, so that it enables high-speed operation.

The invention in its broader aspects is not limited to the specific details and illustrated examples shown and described. Accordingly, it is intended that the present invention cover such modifications and variations provided that they fall within the scope of the appended claims and their equivalents.

What is claimed is:

1. An anti-fuse element in a semiconductor device including a semiconductor substrate, comprising:
    an insulator layer formed over the substrate;
    at least two wiring lines formed on the insulator layer, predetermined portions of the at least two wiring lines being in proximity to each other at a node;
    a dielectric anti-fuse film formed on the two wiring lines at the node;
    a floating electrode formed on the dielectric anti-fuse film to overlap the predetermined portions of the at least two wiring lines at the node, and having no direct contact with a potential source; and
    at least one additional layer inserted between the insulator layer and the semiconductor substrate, the additional layer having no direct contact with the floating electrode at the node,
    wherein upon application of a destructive electric potential difference across the at least two wiring lines, the dielectric anti-fuse film breaks down and conductive paths are respectively formed between the floating electrode and each of the at least two wiring lines.

2. An anti-fuse element according to claim 1, wherein the dielectric anti-fuse film comprises at least one of Si, compounds including Si and N, and compounds including Si and O.

3. An anti-fuse element according to claim 2, wherein the dielectric anti-fuse film further comprises at least one of H, F, Cl.

4. An anti-fuse element according to claim 1, wherein the dielectric anti-fuse film comprises a material selected from a group consisting of undoped amorphous silicon, undoped polycrystalline silicon, and an oxide metal film comprising one of Al, Cu, Ti, W, Mo.

5. An anti-fuse element according to claim 1, wherein the floating electrode comprises a material selected from a group consisting of doped amorphous silicon, doped polycrystalline silicon, a low resistance metal, a refractory metal, an alloy of low resistance metal and refractory metal, a silicide of low resistance metal, and a silicide of refractory metal.

6. An anti-fuse element according to claim 1, wherein tips of the at least two wiring lines are in proximity to each other and along a straight line, and the tips are covered by the dielectric anti-fuse film under the floating electrode.

7. An anti-fuse element according to claim 1, wherein tips of the at least two wiring lines are in proximity to each other at the node and are covered by the dielectric anti-fuse film under the floating electrode.

8. An anti-fuse element according to claim 7, wherein a first capacitance between the tip of a first one of the two wiring lines and the floating electrode equals a second capacitance between the tip of a second one of the two wiring lines and the floating electrode.

9. An anti-fuse element according to claim 7, wherein the at least two wiring lines are respectively oriented at approximately a right angle to each other.

10. An anti-fuse element according to claim 7, wherein one of at least two wiring lines is substantially perpendicular to another of the at least two wiring lines.

11. An anti-fuse element according to claim 1, wherein a tip of one of the at least two wiring lines is proximate to a portion of another of the at least two wiring lines in a region of proximity which is covered by the dielectric anti-fuse film under the floating electrode at the node.

12. An anti-fuse element according to claim 1, wherein respective portions of the at least two wiring lines are substantially parallel to and in proximity to each other at the node, and are covered by the dielectric anti-fuse film under the floating electrode at the node.

13. A semiconductor device including a semiconductor substrate, comprising:
    an insulator layer formed over the semiconductor substrate;

two wiring lines formed on the insulator layer, and having predetermined portions in proximity to each other;

a dielectric anti-fuse film formed on the two wiring lines at the predetermined portions;

a floating electrode formed on the dielectric anti-fuse film to overlap the predetermined portions of the two wiring lines and having no direct contact with a potential source, wherein upon application of a destructive electric potential difference across the wiring lines, the dielectric anti-fuse film breaks down and conductive paths are respectively formed between the floating electrode and each of the two wiring lines; and a functional circuit element selected from a group consisting of a MPU, ROM, RAM, L and a logic connected to one of the two wiring lines.

14. A semiconductor memory device including a semiconductor substrate, comprising:

an insulator layer formed over the semiconductor substrate;

a first and a second wiring line formed on the insulator layer, tips of the first and second wiring lines being in proximity at a node;

a dielectric anti-fuse film formed on the tips of the first and second wiring lines at the node;

a floating electrode formed on the dielectric anti-fuse film to overlap the tips, and having no direct contact with a potential source.;

a word line;

a bit line;

a source line; and a MOS transistor having a source connected to the source line, a gate connected to the word line, a drain connected to the first wiring line, the second wiring line connected to the bit line, wherein upon application of a destructive electric potential difference across the first and second wiring lines, the dielectric anti-fuse film breaks down and conductive paths are respectively formed between the floating electrode and each of the first and second wiring lines to connect the drain to the bit line.

15. An anti-fuse element formed over a substrate, comprising:

an insulator layer formed over the substrate:

at least two wiring lines formed on the insulator layer, predetermined portions of the at least two wiring lines being in proximity to each other at a node, and the at least two wiring lines including a first wire line having a predetermined portion and a second wire line having a predetermined portion;

a dielectric anti-fuse film formed on the two wiring lines at the node; and a floating electrode formed on the dielectric anti-fuse film to overlap the predetermined portions of the at least two wiring lines at the node which includes a first end and a second end, and has no direct contact with a potential source, wherein upon application of a destructive electric potential difference across the at least two wiring lines, the dielectric anti-fuse film breaks down and conductive paths are respectively formed between the floating electrode and each of the at least two wiring lines;

wherein a first capacitor is formed by said first end overlapping the predetermined portion of the first wire line with dielectric anti-fuse film therebetween, and a second capacitor is formed by said second end overlapping the predetermined portion of the second wire line with said dielectric anti-fuse film therebetween, each capacitor having a value, each of the values corresponding to a respective area of overlap.

16. The anti-fuse element of claim 15, wherein the respective values of the capacitors are not equal.

17. The anti-fuse element of claim 15, wherein the respective values of the capacitors are equal.

18. The anti-fuse element of claim 15, wherein said dielectric anti-fuse film comprises at least one of Si compounds including Si and N, and compounds including Si and O.

19. The anti-fuse element of claim 18 wherein said dielectric anti-fuse film further comprises at least one of H, F, Cl.

20. The anti-fuse element of claim 15, wherein said dielectric anti-fusee film comprises a material selected from a group consisting of undoped amorphous silicon, undoped polycrystalline silicon, and an oxide metal film comprising one of Al, Cu, Ti, W, Mo.

21. The anti-fuse element of claim 15, wherein said floating electrode comprises material selected from a group consisting of doped amorphous silicon, doped polycrystalline silicon, a low resistance metal, a refractory metal, an alloy of low resistance metal anti refractory metal, a silicide of low resistance metal, and a silicide of refractory metal.

22. The anti-fuse element of claim 15, wherein tips of said at least two wiring lines are in proximity to each other and along a straight line, and said tips are covered by said dielectric anti-fuse film under said floating electrode.

23. The anti-fuse element of claim 15, wherein tips of said at least two wiring lines are in proximity to each other at said node and are covered by said dielectric anti-fuse film under said floating electrode.

24. The anti-fuse element of claim 23, wherein a first capacitance between said tip of a first one of said two wiring lines and said floating electrode equals a second in capacitance between said tip of a second one of said two wiring lines and said floating electrode.

25. The anti-fuse element of claim 23 wherein said at least two wiring lines are respectively oriented at approximately a right angle to each other.

26. The anti-fuse element of claim 23, wherein one of said at least two wiring lines is substantially perpendicular to another of said at least two wiring lines.

27. The anti-fuse element of claim 15, wherein a tip of one of said at least two wiring lines is proximate to a portion of another of said at least two wiring lines in a region of proximity which is covered by said dielectric anti-fuse film under said floating electrode.

28. The anti-fuse element of claim 15, wherein respective portions of said at least two wiring lines are substantially parallel to and in proximity to each other at said node, and are covered by dielectric anti-fuse film under said floating electrode.

* * * * *